(12) United States Patent
Park (10) Patent No.: US 10,210,291 B2
(45) Date of Patent: Feb. 19, 2019

(54) APPARATUS AND METHOD FOR ANALYZING POWER SYSTEM

(71) Applicant: LSIS CO., LTD., Gyeonggi-do (KR)

(72) Inventor: Kyoung Ho Park, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 249 days.

(21) Appl. No.: 15/200,458

(22) Filed: Jul. 1, 2016

(65) Prior Publication Data

US 2017/0011148 A1  Jan. 12, 2017

(30) Foreign Application Priority Data

Jul. 9, 2015  (KR) .................. 10-2015-0097499

(51) Int. Cl.
| | |
|---|---|
| *G06G 7/54* | (2006.01) |
| *G06F 17/50* | (2006.01) |
| *H02J 3/36* | (2006.01) |
| *H02J 3/00* | (2006.01) |

(52) U.S. Cl.
CPC ............ *G06F 17/5009* (2013.01); *H02J 3/36* (2013.01); *H02J 2003/007* (2013.01); *H02J 2003/365* (2013.01); *Y02E 60/60* (2013.01); *Y02E 60/76* (2013.01); *Y04S 40/22* (2013.01)

(58) Field of Classification Search
CPC .................................................. G06F 17/5009
USPC ........................................................ 703/18
See application file for complete search history.

(56) References Cited

U.S. PATENT DOCUMENTS

| | | | |
|---|---|---|---|
| 5,677,852 A | 10/1997 | Juhlin | |
| 9,104,999 B2 | 8/2015 | Kim et al. | |
| 2015/0008672 A1* | 1/2015 | Garcia | H02J 3/24 290/44 |
| 2015/0066402 A1 | 3/2015 | Feng et al. | |
| 2015/0131342 A1 | 5/2015 | Larsson et al. | |

FOREIGN PATENT DOCUMENTS

| | | |
|---|---|---|
| CN | 101662217 A | 3/2010 |
| CN | 102184331 A | 9/2011 |
| CN | 102623968 A | 8/2012 |
| CN | 103199511 A | 7/2013 |
| CN | 104471852 A | 3/2015 |
| EP | 2688191 A1 | 1/2014 |
| JP | 09-117061 A | 5/1997 |
| JP | 2001-54237 A | 2/2001 |
| JP | 2004-242452 A | 8/2004 |
| JP | 2008-086152 A | 4/2008 |

(Continued)

OTHER PUBLICATIONS

"Parallel Processing and Hybrid Simulation for HVDCNSC PSCAD Studies" by Garth D. Irwin et al., 2012, 10th IET International Conference on AC and DC Power Transmission.*

(Continued)

*Primary Examiner* — Timothy A Mudrick
(74) *Attorney, Agent, or Firm* — K&L Gates LLP (57) ABSTRACT

Methods for analyzing a power system is presented. In some embodiments, a method may analyze system data, reduce the analyzed system data based on a set reduction level, model a device and a high voltage direct-current (HVDC) system interlinked to the device, and reflect the modeled result to the reduced system data.

14 Claims, 6 Drawing Sheets

(56) References Cited

FOREIGN PATENT DOCUMENTS

| | | |
|---|---|---|
| JP | 2015-053847 A | 3/2015 |
| KR | 10-2009-0046543 A | 5/2009 |
| KR | 10-0964298 B1 | 6/2010 |
| KR | 10-1274168 B1 | 6/2013 |
| KR | 10-1505073 B1 | 3/2015 |
| KR | 10-2015-0037415 A | 4/2015 |
| WO | 9407291 A1 | 3/1994 |

OTHER PUBLICATIONS

Tadao Kawai, et al, "Real Time Simulator for Power System Analysis," Hitachi Review, Japan, Hitachi, Ltd., Feb. 1992, vol. 74, No. 2, pp. 73-78.
Toshio Iizuka, "Electric power and industrial system meeting the needs of the 21st century," Mitsubishi Denki Giho, 2000, vol. 74, No. 12, Mitsubishi Electric Engineering Company Limited, vol. 74, pp. 36-39.
Extended European Search Report for Application No. EP16162374.9 dated Dec. 8, 2016, in 9 pages.
Chinese Office Action for related Chinese Application No. 201610512733.2; action dated Nov. 14, 2018; (10 pages).

* cited by examiner

The E-TRAN program will translate data from PSSE into PSCAD Power System Simulation Program.

Fist Select Which Type of PSS/E.raw File is to be Converted:

○ V26    ○ V29    ○ V30    ○ V31    ○ V32    ⦿ V33

There are 5 Steps required:

Step 1:Select Input File
Step 2:Select Conversion Options
Step 3:Select Output File
Step 4:Final Review and Conversion Process
Step 5:Raview of Log Files Click on NEXT to processd to the next Step...

<BACK(B) | NEXT(N)>

FIG. 4

```
┌─────────────────────────────────────────────────────────────────┐
│ ┌─Select PSS/E Loadflow Input File(.raw):─────────────────────┐ │
│ │ File    ┌──────────────────────────────────────────────┐    │ │
│ │ Name:   │C:\Users\PEL\Desktop\ETRAN\2021_100%.RAW      │    │ │
│ │         └──────────────────────────────────────────────┘    │ │
│ └─────────────────────────────────────────────────────────────┘ │
│ ┌─Select PSS/E Dynamics Input File(.dvr)─────────────────────┐  │
│ │    ☑ Enable Reading of .dyr File?                          │  │
│ │ File    ┌──────────────────────────────────────────────┐   │  │
│ │ Name:   │C:\Users\PEL\Desktop\ETRAN\STABILITY(20130320_kpx│ │  │
│ │         └──────────────────────────────────────────────┘   │  │
│ └────────────────────────────────────────────────────────────┘  │
│ ┌─Select PSS/E Sequence InputFile(.seq)──────────────────────┐  │
│ │    ☑ Enable Reading of .seq File?                          │  │
│ │ File    ┌──────────────────────────────────────────────┐   │  │
│ │ Name:   │C:\Program Files(x86)\E-TRAN_V3\Examples\39bus.│  │  │
│ │         └──────────────────────────────────────────────┘   │  │
│ └────────────────────────────────────────────────────────────┘  │
│ ┌─Select PSCAD Output Case File(note-do not use spaces in the filename):─┐
│ │   Version to Output :    ○ 4.0   ○ 4.1   ● 4.2   ○ x4       │ │
│ │ File    ┌──────────────────────────────────────────────┐    │ │
│ │ Name:   │C:\Users\PEL\Desktop\ETRAN\2021_3.pec         │    │ │
│ │         └──────────────────────────────────────────────┘    │ │
│ └─────────────────────────────────────────────────────────────┘ │
│                                                                 │
│                        ┌─────────┬─────────┐                    │
│                        │<BACK(B) │NEXT(N)> │                    │
│                        └─────────┴─────────┘                    │
└─────────────────────────────────────────────────────────────────┘
```

FIG. 5

```
┌─Convert Entire Circuit(choose option for sorting of main page):─┐
│  ○ By Proximity    ○ By Area    ○ By Zone    Strat Bus [0]      │
└─────────────────────────────────────────────────────────────────┘
    ○ Convert a Zone   Zone#[ 1 ]  ○ Convert an Area  Area#[    ]
    ● Convert 1 Bus and N Busses Back Bus # [ 7059] Busses Back [3]
    ○ Convert Busses Listed [30 31 32 33 34 35 36 37         ]

☐ Keep Busses Above this Voltage(kV):    [0]
    ☐ Keep Busses Below this Voltage(kV):    [1000000]
    ☐ Keep Busses Between These Voltage(kV): [1000000]  And [0]
    ☐ Keep Generators In Converted System    From how far away [0]
    ☑ From an Equivalent for the Rest of the Network?
┌─Convert -ve Impedances in Equiv to +ve?─┐┌─Line Model Selection:──┐
│  ○ No, Keep them -ve                    ││  ○ Use Bergeron(where poss│
│  ● Yes, make R +ve                      ││  ● Always Use PI Sections │
│  ○ Yes, make R and X +ve                ││                           │
└─────────────────────────────────────────┘└───────────────────────────┘

[ <BACK(B) | NEXT(N)> ]
```

APPARATUS AND METHOD FOR ANALYZING POWER SYSTEM

CROSS-REFERENCE TO RELATED APPLICATIONS

The present application claims the benefit of Korean Patent Application No. 10-2015-0097499, filed on Jul. 9, 2015, which is hereby incorporated by reference in its entirety.

BACKGROUND

The present disclosure relates to an apparatus and method for analyzing a power system.

According to national economic growth and improvement in people's living standards, convenience of use and power consumption, which is an engine of the national economic growth, continuously increase and an increase in power demand makes a power system complicated, diversified, and having large capacity. However, the 2003 blackout occurring in North America and Europe results from that an initial small-scale accident is not rapidly detected and handled to allow power failure to spread to the entire power system due to weakness of a system for data acquisition and monitoring control for the power system. Accordingly, importance is being magnified for general operation state data acquisition, system analysis, and remote detection control for the power system in an energy management system.

In addition, importance is also being magnified for a method for analyzing a power system which becomes complicated, diversified, and has large capacity.

Recently, a technique is actively being researched which transmits DC power by using a high voltage direct-current (HVDC) system.

On the other hand, as a software tool for analyzing a power system, a Power System Simulator for Engineering (PSS/E) software tool and a PSCAD software tool are widely used.

The PSS/E software tool, which is a software tool for simulating, analyzing, and optimizing power system characteristics such as evaluation for a power transmission network and electricity generation under a steady state condition and a dynamic state condition, may approximately analyze the overall power system. However errors frequently occur because of handling too much system data. In addition, the PSS/E software tool is not capable of newly reflecting, for example, data for an additional element such as an HVDC system or generator.

On the other hand, the PSCAD software tool is a software tool for analyzing a partial power system through HVDC modeling, but is not linked to another power system.

Accordingly, an integrated analysis is not enabled for an additional system such as an HVDC system or generator as well as for an existing power system in use.

SUMMARY

Embodiments provide an apparatus and method for analyzing a power system for solving the above and other limitations.

Embodiments also provide an apparatus and method for analyzing a power system capable of reducing errors in system analysis.

Embodiments also provide an apparatus and method for analyzing a power system capable of reflecting an additional element such as a generator as well as easily analyzing an overall power system including an HVDC system.

In one embodiment, a method for analyzing a power system includes: analyzing system data; reducing the analyzed system data based on a set reduction level; modeling a device and a high voltage direct-current (HVDC) system interlinked to the device; and reflecting the modeled result to the reduced system data.

In another embodiment, an apparatus for analyzing a power system includes: an analyzing unit configured to analyze system data; a reduction unit configured to reduce the system data based on a set reduction level; and a modeling module configured to model a device and an HVDC system interlinked with the device and to reflect the modeled result to the reduced system data.

The details of one or more embodiments are set forth in the accompanying drawings and the description below. Other features will be apparent from the description and drawings, and from the claims.

DETAILED DESCRIPTION

Reference will now be made in detail to the embodiments of the present disclosure, examples of which are illustrated in the accompanying drawings.

As can be seen from the foregoing, the above-described embodiments is not limited to the configurations and methods of the embodiments described above, but the entirety of or a part of the embodiments may be configured to be selectively combined such that various modifications of the embodiments can be implemented.

Reference will now be made in detail to the embodiments of the present disclosure, examples of which are illustrated in the accompanying drawings, in which like numbers refer to like elements throughout, and a repetitive explanation will be omitted. In the following description, usage of suffixes such as 'module', 'part' or 'unit' used for referring to elements is given merely to facilitate explanation of the present disclosure, without having any significant meaning by itself. In the following description, detailed descriptions of well-known functions or constructions will be omitted since they would obscure the disclosure in unnecessary detail. In addition, the accompanying drawings are used to help easily understand the technical idea of the present disclosure and it should be understood that the idea of the present disclosure is not limited by the accompanying drawings. This disclosure should not be construed as limited to specific disclosure forms, and the spirit and scope of the disclosure should be understood as incorporating various modifications, equivalents and substitutions.

Figure 1:
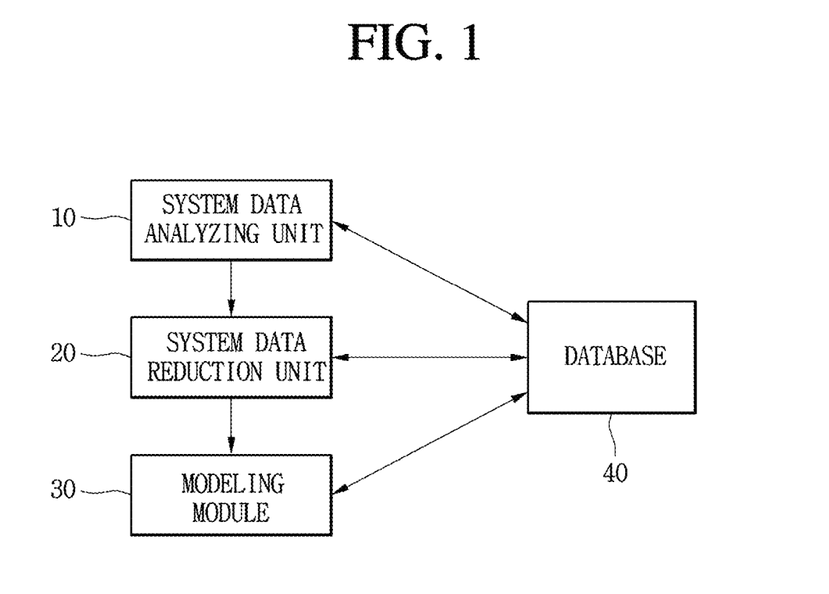
FIG. 1 is a block diagram of an apparatus for analyzing a power system according to an embodiment.

FIG. 1 is a block diagram of an apparatus for analyzing a power system according to an embodiment.

Referring to FIG. 1, an apparatus for analyzing a power system according to an embodiment includes a system data analyzing unit 10, a system data reduction unit 20, a modeling module 30, and a database 40.

Here, the system data analyzing unit 10 may include a first software tool, a system data reduction unit 20 may include a second software tool, and the modeling module 30 may include a third software tool, but the embodiment is not limited thereto.

For example, the first software tool may be a PSS/E software tool, the second software tool may be an E-TRAN software tool, and the third software tool may be a PSCAD software tool, but the embodiment is not limited thereto.

The system data analyzing unit 10 may analyze system data using the first software tool.

The system data analyzing unit 10 may analyze all system data collectable from a power system. The power system may include a 22.9 kV power system, a 154 kV power system, a 345 kV power system, and a 765 kV power system.

The system data may include generator-related data, transformer-related data, bus-related data, and load-related data. For example, the respective related data may include types, capacity, and characteristics, etc.

The system data analyzing unit 10 may analyze all system data collected from the power systems.

As described above, flow calculation, short circuit capacity, or fault current, etc., for a bus in which an HVDC system is installed may be analyzed on the basis of the collected system data. In addition, demand and supply may be analyzed for an output amount and a load amount of a bus of a generator and a bus of load.

Through the foregoing, analysis may be enabled for state stability and transient stability. The state stability includes flow calculation, fault current calculation, and short circuit capacity calculation. The transient stability is used for analyzing dynamic characteristics of a synchronizer such as a HVDC/FACTS (Flexible AC Transmission System)/generator.

The system data analyzed by the system data analyzing unit 10 may be stored in the database 40.

The system data reduction unit 20 may reduce the system data analyzed by the system data analyzing unit 10.

The system data for reduction may be supplied from the system data analyzing unit 10 to the system data reduction unit 20, or the system data analyzed by the system data analyzing unit 10 may be stored in the database 40 and then supplied to the system data reduction unit 20 in response to a request therefrom. However, the embodiment is not limited thereto.

The system data reduction unit 20 will be described in detail with reference to FIG. 2.

Figure 2:
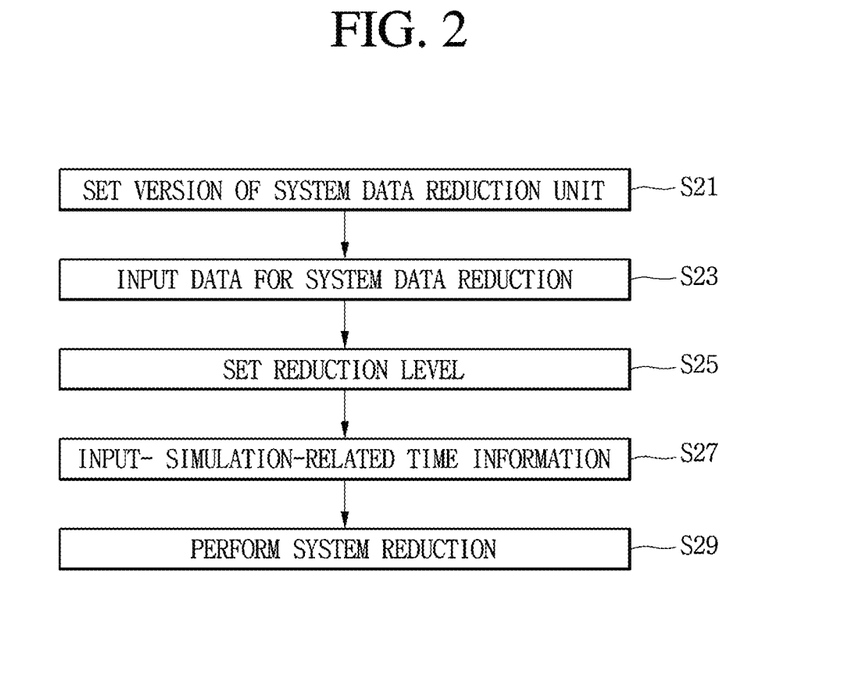
FIGS. 2 to 7 are screens for explaining an operation of a system data reduction unit, according to an embodiment.

FIG. 2 is a flowchart for explaining an operation method of the system data reduction unit.

Referring to FIG. 2, the system data reduction unit 20 sets a version of itself (operation S21).

Figure 3:
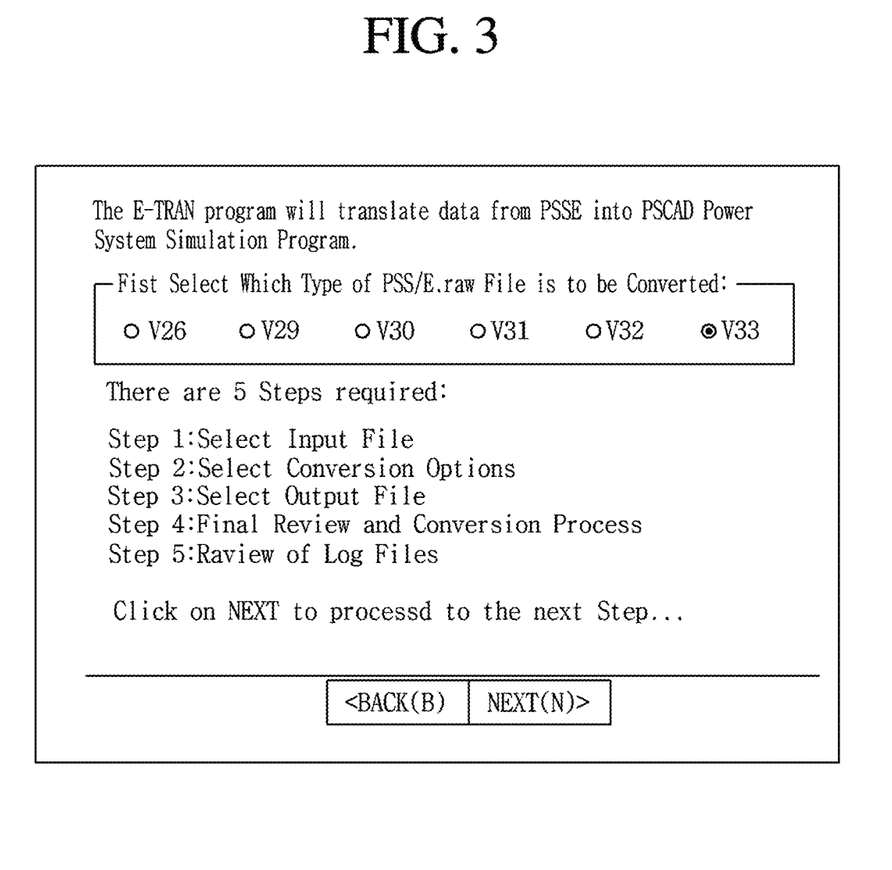

Firstly, a version of the first software tool installed and operating in the system data analyzing unit 10 may be selected and input. As illustrated in FIG. 3, when the version of the PSS/E software tool installed and operating in the system data analyzing unit 10 is V33, V33 may be selected and input.

Then, a version of the second software tool installed in the system data reduction unit 10 may be set with the version of the first software tool installed and operating in the system data analyzing unit 10. For example, the version of the E-TRAN software tool provided in the system data reduction unit 10 may be set with the version, e.g., V33, of the PSS/F software tool installed and operating in the system data analyzing unit 10.

When the version of the second software tool provided in the system data reduction unit 20 is different from that of the first software tool installed and operating in the system data analyzing unit 10, a system data-reduced file in the system data reduction unit 20 may not be simulated by the third software tool installed in the modeling module 30.

Referring to FIG. 2 again, the system data reduction unit 20 inputs data for system data reduction (operation S23).

As the data for system data reduction, the system data analyzed in the system data analyzing unit 10 may be selected and input, or dynamic data may be selected and input. The dynamic data may mean system data of devices including dynamic characteristics.

Figure 4:
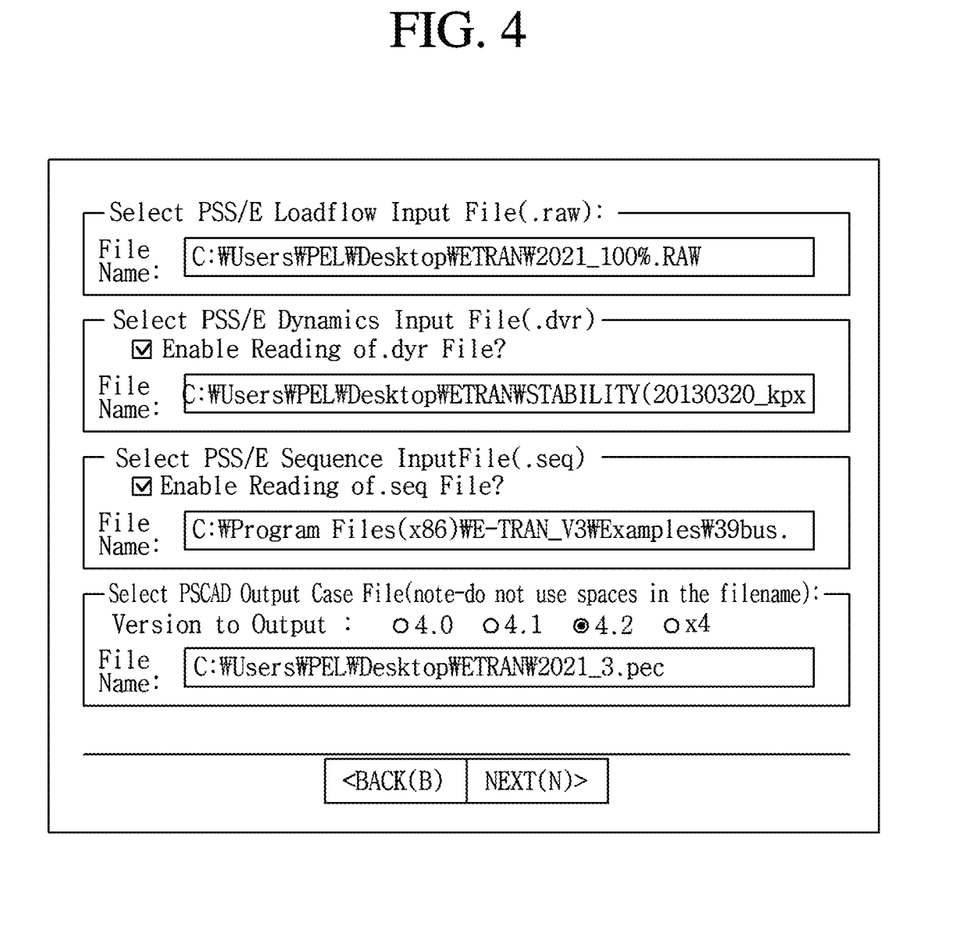

As illustrated in FIG. 4, the system data analyzed in the system data analyzing unit 10 may be input to a Select PSS/E Load flow Input File item, and the dynamic data may be input to a Select PSS/E Dynamic Input File item.

Additionally, sequence data of a system configuration may be input for a precise fault analysis for each fault type. The sequence data may be input to a Select PSS/E Sequence Input File item, as illustrated in FIG. 4. Such an input may be omitted for a transient-stable analysis, but the embodiment is not limited thereto.

The transient-stable analysis may mean that analysis is performed to allow a generator to maintain a stable state with respect to an abrupt change such as generator disconnection, rapid load change, ground fault, or short circuit. In addition, a stability analysis may be performed to analyze dynamic characteristics of a synchronizer such as an HVDC/FACTS/generator.

The FACTS rapidly and precisely controls a power system by using a large capacity inverter, and may realize an improvement of stability of the power system, an increase of transmission capacity, an improvement of power quality, and a reduction of transmission cost in the power system.

In addition, a version of PASCAD data to be converted may be input, and the PASCAD data version may be input to a Select PSCAD Output Case File item of FIG. 4.

Referring to FIG. 2 again, the system data reduction unit 20 sets a reduction level (operation S25).

In setting the reduction level, firstly a reference bus of the system data analyzed in the system data analyzing unit 10 is set and then to what level the system data reduction is performed from the reference bus is set.

Figure 5:
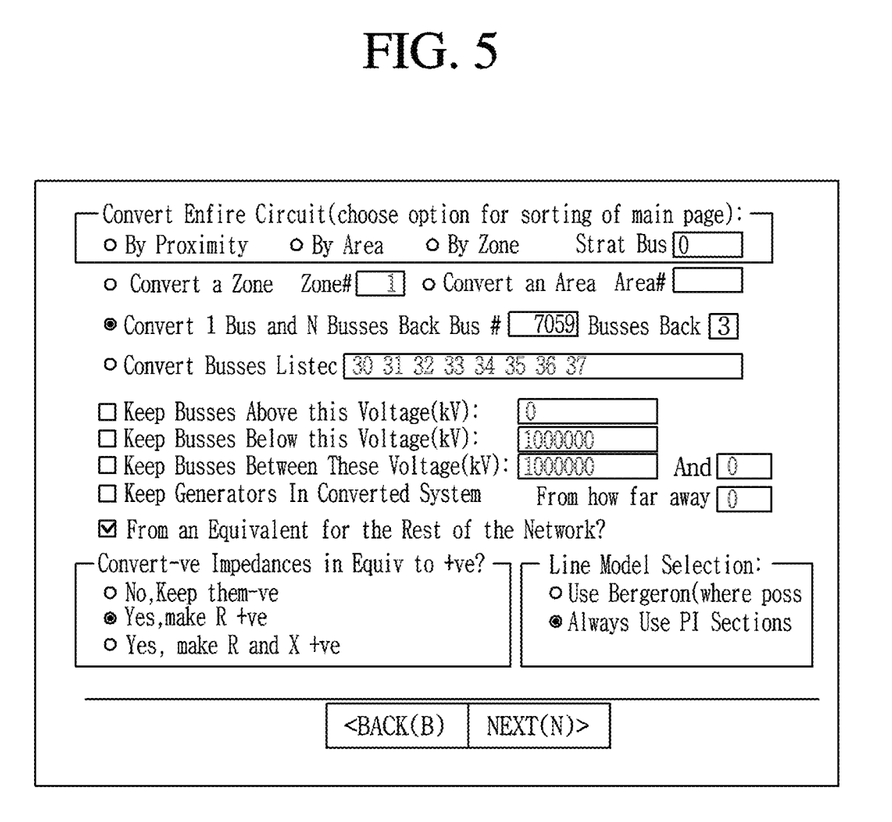

For example, as illustrated in FIG. 5, a bus of desired PSS/E system data may be set on a Convert Enfire Circuit window, and to what level the system data reduction is performed from the reference bus may be set on a Business Back window.

For example, when "3" is set on the Business Back window, buses linked from the reference bus to level 3 are represented in detail in a reduction system in the PASCAD, and buses after level 3 may be represented as reduced to a bus of generator and a bus of load, etc., which are reflected to a short circuit ratio (SCR) value.

Here, the level may be one of a 22.9 kV bus, a 154 kV bus, a 345 kV bus, and a 765 kV bus. For example, level 1 may be the 765 kV bus, level 2 may be the 345 kV bus, level 3 may be the 154 kV bus, and level 4 may be the 22.9 kV, but the embodiment is not limited thereto.

In this way, since a specific level is set and reduction and analysis of the system data is performed based on a bus within the specific level without analyzing all the system data such that a limitation that errors is resulted from analyzing overall system data may be addressed. In addition, a time taken to analyze data may be dramatically reduced with an analysis through data reduction instead of the overall data analysis.

Referring to FIG. 2 again, the system data reduction unit 20 inputs simulation-related time information (operation S27).

Figure 6:
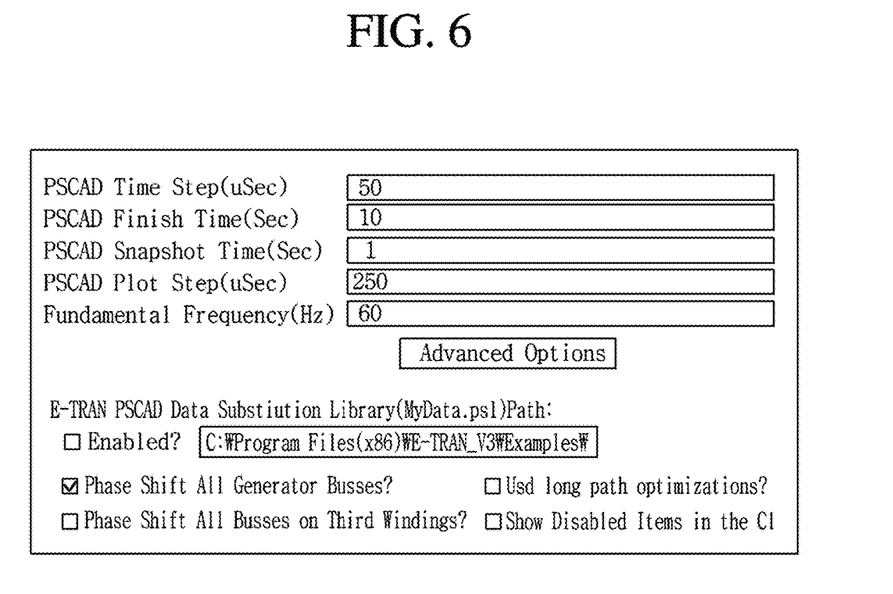

As illustrated in FIG. 6, the simulation-related time information may include at least one of a PSCAD Time Step, a PSCAD Finish Time, a PSCAD Snapshot Time, a PSCAD Plot Step and a Fundamental Frequency.

The PSCAD simulation time step is an input value pertaining to when the simulation is executed and in what step a result value of a corresponding graph is represented. For example, when the total time for simulation is 10 seconds and a time step of 0.1 second is given to points for drawing a graph for 10 seconds, one line may be drawn.

The PSCAD Finish Time is a total simulation time (10 seconds in the above example), the PSCAD Snapshot Time is a time for checking a simulation result with a graph during the simulation, the PSCAD Plot Step is a time (0.1 second in the above example) for representing a graph for the simulation result value, and the Fundamental Frequency is a frequency (typically 60 Hz in Korea) of a system to be simulated.

Figure 7:
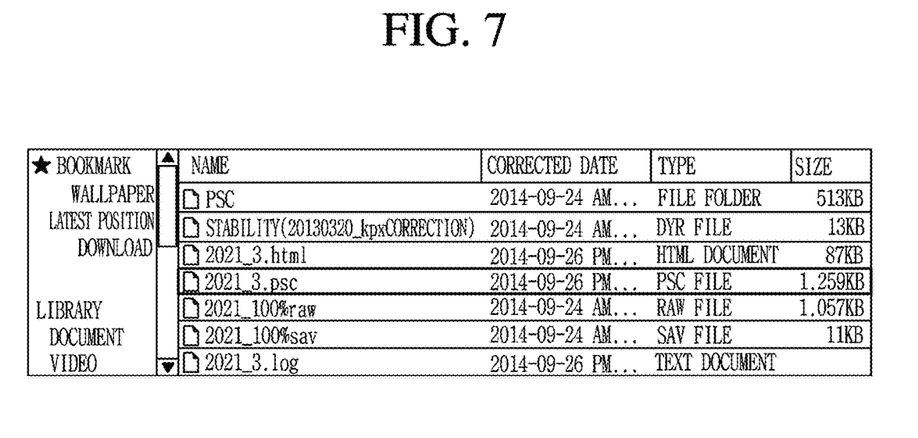

Referring to FIG. 2, in this way, the system data reduction unit 20 performs data reduction based on the selected or input data (operation S29). By executing the data reduction, the PSS/E system data is reduced and converted to a PSCAD file and as illustrated in FIG. 7, various types of files are generated and stored in the database 40. The various types of files may include, for example, an html file, a psc file, and a log file.

In this way, the system data reduced by the system data reduction unit 20 may be stored in the database 40.

In addition, the system data reduced in this way is supplied to the modeling module 30 and analyzed by the modeling module 30.

A situation, fault probability, or performance of a system may be figured out through the system data analysis.

Referring to FIG. 1 again, the modeling module 30 may perform modeling on a generator and an HVDC system interlinked with the generator, and may reflect the modeled result to the reduced system data.

In the embodiment, the HVDC system uses a current type HVDC system, and the generator uses a Mass model generator, but the embodiment is not limited thereto.

Data output as the modeled result may be stability of a system interlinked with a corresponding model. For example, stability of an HVDC system interlinked with the generator may be output as the modeled result.

The modeled result is reflected to the reduced system data, and robustness of devices and system stability may be checked.

Here, the generator is provided in a power plant interlinked with the HVDC system. When a plurality of power plants are provided with the HVDC system linked thereto, a Sub-Synchronous Resonance (SSR) analysis is necessary between the respective power plants and the HVDC system.

Since the SSR exerts a bad influence on reduction in shaft torsion vibration between a shaft system of a large turbine generator and a rectifier controller of an HVDC system, it is necessary to properly tune a control constant and when vibration of shaft torsion is bad, a proper shaft torsion damping controller is required to be added to the HVDC rectifier controller as an auxiliary controller. In other words, the SSR phenomenon means a state where an electricity system, which includes a generator and a power transmission line, exchanges energy with a mechanical system including a turbine generator, etc., in a frequency range lower than a synchronization frequency. In this way, the SSR is mainly resulted from a phenomenon that a vibration is generated at a sub-synchronous frequency smaller than a rated frequency in a network, when a system receives an electrical disturbance and energy is exchanged between electrostatic energy of serial capacitors in a transmission line and magnetic energy of inductance.

The embodiment may enable a modeling result of an HVDC system or a generator linked to the HVDC system to be reflected to the reduced system data and enable an SSR analysis based on the system data reflected in this way.

Figure 8:
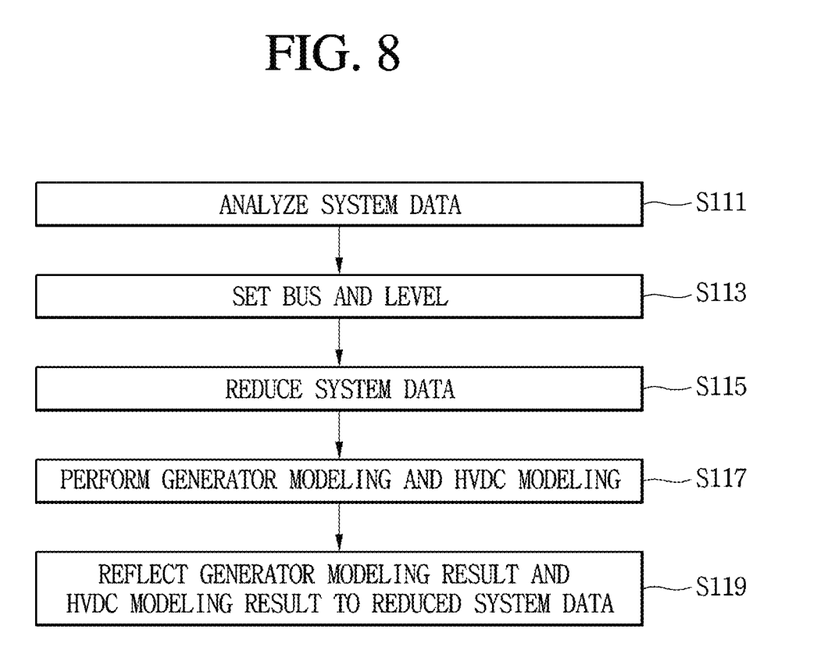
FIG. 8 is a flowchart of a method for analyzing a power system according to an embodiment.

FIG. 8 is a flowchart of a method for analyzing a power system according to an embodiment.

Referring to FIGS. 1 and 8, firstly, the system data analyzing unit 10 performs a system data analysis based on system data collected in advance (operation S111).

The system data may be all data collectable from a power system. The power system may include a 22.9 kV power system, a 154 kV power system, a 345 kV power system, and a 765 kV power system.

For example, the system data may include generator-related data, transformer-related data, bus-related data, and load-related data. For example, the related data may include types, capacity, and characteristics, etc.

Then the system data reduction unit 20 may set a bus for system data reduction and a reduction level (operation S113).

As illustrated in FIG. 2, the system data reduction unit 20 may set a version of the system data reduction unit 20 and receive a simulation-related time.

The system data analyzed by the system data analyzing unit 10 may be stored in the database 40.

The system data reduction unit 20 may set a bus desired to perform system data reduction among the analyzed system data and set a level desired to perform system data reduction from the bus.

In this way, when the bus and reduction level are set, the system data reduction may be performed based on the bus within the set reduction level. In this way, a range of system data reduction may be differed by adjusting the reduction level.

For example, when a 345 kV level is set, system data reduction is performed on buses connected to a class of 345 kV or higher, for example, a 345 kV system and a 765 kV system, and system data reduction is not performed on, for example, a class of 345 kV or lower, for example, a 154 kV system.

The system data reduction unit 20 may allow the version of the second software tool to be set to the version of the first software tool used for the system data analysis, and may receive a version of PSCAD data to be converted.

The system data reduction unit 20 performs system data reduction based on the bus and system data reduction level set in this way (operation S115).

The system data reduction result may be converted to the PSCAD data version, and various types of files such as an html file, a psc file, and a log file may be generated and stored in the database 40.

The modeling module 30 may perform modeling on a generator and an HVDC system interlinked with the generator (operation S117).

The HVDC modeling and generator modeling may be performed by using the third software tool.

Stability of the HVDC system interlinked with the generator may be output as the modeling result.

The modeling module 30 reflects the result of the generator modeling and the result of the HVDC modeling to the reduced system data (operation S119).

The modeled result is reflected to the reduced system data, and robustness of devices and system stability may be checked.

The robustness of the generator devices and stability of the HVDC system may be checked by the above-described SSR analysis.

According to at least one of embodiments, since system data reduction and analysis are performed based on a bus corresponding to a specific reduction level without analyzing all the system data, limitations that an error occurs due to data analysis for the overall system data may be addressed and analysis through data reduction instead of analysis for the overall data is enabled, and a time taken for data analysis may be dramatically reduced.

In addition, according to at least one of the embodiments, universality and applicability of a power system may be enlarged by performing a system analysis on not only a generator but also an HVDC system interlinked with the generator.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art. While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A method for analyzing a power system comprising:
   analyzing system data;
   setting a level of a system data reduction;
   reducing the analyzed system data based on the set level of the system data reduction;
   modeling a device and a high voltage direct-current (HVDC) system, the HVDC system configured to be interlinked to the device; and
   reflecting a modeled result to the reduced system data,
   wherein the setting the level of the system data reduction comprises
   setting a reference bus of the analyzed system data, and
   setting the level of the system data reduction based on the set reference bus.

2. The method according to claim 1, wherein reducing the analyzed system data comprises:
   setting a version of a second software tool used for the reduction;
   inputting the system data for system data reduction;
   receiving simulation-related time information for the system data reduction; and
   performing the system data reduction based on the set version of the second software tool, the inputted system data, the level of the system data reduction, and the received simulation-related time information.

3. The method according to claim 2, wherein setting the version of the second software tool used for reduction comprises setting the version of the second software tool as a version of a first software tool used for the analysis.

4. The method according to claim 3, wherein the first software tool is a PSS/E software tool and the second software tool is an E-TRAN software tool.

5. The method according to claim 2, wherein receiving simulation-related time information for the system data reduction comprises receiving at least one of the analyzed system data, dynamic data, and sequence data.

6. The method according to claim 2, wherein the simulation-related time information comprises at least one of a PSCAD Time Step, a PSCAD Finish Time, a PSCAD Snapshot Time, a PSCAD Plot Step, and a Fundamental Frequency.

7. The method according to claim 2, wherein performing the system data reduction comprises generating an html file, a psc file, and a log file that reflects a reduction result.

8. The method according to claim 1, further comprising:
   storing the analyzed system data and the reduced system data in a database.

9. The method according to claim 1, further comprising:
   performing a sub-synchronous resonance (SSR) analysis based on the reflected system data.

10. The method according to claim 1, wherein the device comprises a generator.

11. An apparatus for analyzing a power system comprising:
    an analyzing unit configured to analyze system data;
    a reduction unit configured to reduce the analyzed system data based on a set level of system data reduction; and
    a modeling module configured to model a device and a high voltage direct-current (HVDC) system configured to interlink with the device and reflect a modeled result to the reduced system data,
    wherein the reduction unit is further configured to
    set a reference bus of the analyzed system data, and
    set the level of the system data reduction based on the set reference bus.

12. The apparatus according to claim 11, wherein the device comprises a generator.

13. The apparatus according to claim 11, wherein the set level of the system data reduction is one of a 22.9 kV bus, a 154 kV bus, a 3345 kV bus, or a 765 kV bus.

14. The apparatus according to claim 11, wherein the analyzing unit includes a first software tool, the reduction unit includes a second software tool, and the modeling module includes a third software tool.

* * * * *